(12) United States Patent
Ducros et al.

(10) Patent No.: US 6,558,578 B2
(45) Date of Patent: May 6, 2003

(54) CONDUCTIVE PASTE FOR THE ELECTRICAL INDUSTRY AND ITS USE

(75) Inventors: Jean-Alec Ducros, Fontainebleau (FR); Mohamed Aït El Cadi, La Varenne (FR)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 09/782,212

(22) Filed: Feb. 13, 2001

(65) Prior Publication Data

US 2001/0048098 A1 Dec. 6, 2001

(30) Foreign Application Priority Data

May 30, 2000 (DE) .......................... 100 26 633

(51) Int. Cl.$^7$ .............. H01B 1/00; H01B 1/20; B05D 5/00
(52) U.S. Cl. .......... 252/511; 252/500; 252/502; 252/506; 252/511; 252/512; 252/514; 524/495; 524/496; 264/104; 264/105; 427/58; 427/122; 427/123; 174/35 R; 361/800; 428/402
(58) Field of Search .............. 252/500, 512, 252/514, 502, 511, 506; 524/495, 496; 264/104–105; 427/58, 122, 123; 174/35 R; 361/800; 428/402

(56) References Cited

U.S. PATENT DOCUMENTS

| | | | | |
|---|---|---|---|---|
| 4,011,360 A | | 3/1977 | Walsh | 428/402 |
| 4,545,914 A | * | 10/1985 | Graiver et al. | 252/511 |
| 5,250,228 A | * | 10/1993 | Baigrie et al. | 252/511 |
| 5,852,092 A | * | 12/1998 | Nguyen | 524/404 |
| 5,882,729 A | | 3/1999 | Kahl et al. | 427/265 |
| 6,329,014 B1 | | 12/2001 | Kahl et al. | 427/58 |

FOREIGN PATENT DOCUMENTS

JP          10316901     * 12/1998   ............ C09D/5/24

* cited by examiner

*Primary Examiner*—Mark Kopec
*Assistant Examiner*—Kallambella Vijayakumar
(74) *Attorney, Agent, or Firm*—Pitney, Hardin, Kipp & Szuch LLP

(57) ABSTRACT

Conductive paste for the electrical industry based on at least one elastomer (10) and on an admixture of conducting particles in the form of fibers (20), in which the fibers (20) are flexible and have been embedded in the elastomer (10) in random orientation and with formation of a large number of contact points.

10 Claims, 1 Drawing Sheet

CONDUCTIVE PASTE FOR THE ELECTRICAL INDUSTRY AND ITS USE

BACKGROUND OF THE INVENTION

The invention relates to a conductive paste for the electrical industry, and also to its use.

Materials of this type are widely used and are required by a wide variety of applications. They have gained particular importance, for example, in connection with the sealing of electromagnetically shielded housings in electronic devices which emit electromagnetic radiation or can be disturbed by electromagnetic radiation penetrating from outside. To give EMI (electromagnetic interference) shielding or, respectively, RFI (radio frequency interference) shielding, and to improve electromagnetic compatibility (EMC), the housings are produced from a material which is electrically conducting or has been coated with an electrical conductor. It is known that gaskets made from an electrically conductive flexible material can be used so that the region of the joints at which the parts of the housing are joined together is also given shielding.

An example of a material of this type is known from U.S. Pat. No. 4,011,360. This known material is based on an elastomer, specifically a silicone rubber material which has an admixture of electrically conducting particles. This material polymerizes when exposed to atmospheric moisture at room temperature.

DE 43 19 965 C2 discloses the use of a material of this type for producing the housings described at the outset. The starting material is extruded as a strand of paste directly in the region of the joint onto one of the parts of the housing, and is polymerized there to form the gasket. This process is also known by the skilled worker as the formed-in-place-gasket process.

Materials of this type with electrically conducting particles are also used to form contact points or contact areas, known as contact pads, thus taking on the function of contact elements.

The electrically conductive particles may have various shapes. Particles frequently encountered have the shape of flakes, spheres, irregularly shaped bodies or fibers. In the simplest case, the particles are manufactured directly from conducting material. It is moreover possible to prepare particles from nonconducting materials and then to cover or coat these with conductive material. A factor common to these particles is that they have a given shape and therefore reduce the elasticity of the cured final product. The elasticity here is given solely by the elastomer into which the particles have been embedded.

To achieve good conductivity it is generally necessary to provide more than 50% by volume of conductive particles to ensure the required contact of the particles with one another. The resultant proportion of elastomer is comparatively small and leads to a rigid final product with disadvantageous mechanical properties. These materials are moreover very expensive, since the price of the particles is high.

SUMMARY OF THE INVENTION

The object of the present invention is to provide a material of the type mentioned at the outset in which the problems described have been overcome. The material provided should have improved mechanical properties and moreover be inexpensive, in order for example to open up even those application sectors in which economic reasons have hitherto prevented the use of large elastomer gaskets.

The invention is based on the concept of using conductive particles in the form of fibers which are flexible. These are admixed in random orientation with the elastomer in a way which produces a large number of contact points. The embedding of the fibers in the elastomer therefore takes the form of an irregular three-dimensional matrix. The contact points ensure ideal and statistically random distribution conductivity within the material.

Depending on the nature of the fibers used, one preferred embodiment allows the selected proportion of fibers to be less than 50%, based on the total volume of the material. It is preferably possible to reduce the proportion of fibers to less than 25% by volume. Compared with materials previously available, this gives a significant improvement in mechanical properties, in particular in the flexibility of the polymerized final product, which is moreover very inexpensive.

It is preferable for the fibers used to have a length/diameter ratio of more than 2. Ideal results can be achieved if the length/diameter ratio is more than 10. The shape of fibers of this type makes them highly flexible, and they therefore give an ideal result with regard to the mechanical properties of the final product.

An embodiment further optimized in this respect provides for the use of fibers with a diameter of less than 0.1 mm. These extremely thin fibers can be embedded into the elastomer in an ideal manner, such that the embedded fibers have virtually no adverse effect on the flexibility of the elastomer.

It is also possible to design the material in a manner known per se as a two- or multicomponent material. The two components are not mixed until immediately prior to processing. This method can give a very inexpensive material which is easy to process.

Depending on the application, the material selected here may be one which polymerizes at room temperature. On the other hand it is also possible to provide a material which polymerizes on exposure to heat, so that the polymerization procedure can be controlled. This is of particular importance with a view to automated mass production.

The formulation of the material is preferably such that it has low viscosity. It is therefore particularly suitable for forming an electrically shielding gasket for a housing, the material for the gasket being applied in the form of a strand directly in the region of a joint of a housing. Typical applications for a material of this type are the formation of a gasket for a mobile telephone housing or the like.

It is also possible to design a material with high viscosity, for example in order to produce sealing elements in the form of sealing strips, sealing pads, sealing tubes or O-rings, by injection molding or extrusion.

One specific example of an application provides for the use of the conductive paste for producing a flexible gasket for an electromagnetically shielded housing. A paste of the material is applied by means of a path-controlled nozzle directly to a part of the housing in the region where the housing has a joint to be sealed. The nozzle is moved over the part of the housing by means of computer-controlled metering equipment while the plastics material is being discharged. The velocity of relative movement of the nozzle and the part of the housing is determined by the viscosity of the paste, the amount and velocity of the paste emerging from the nozzle, the cross-sectional area of the nozzle passage, the desired cross-sectional profile of the gasket to be produced and the makeup of the material.

The strand made from the paste and dispensed in this way polymerizes under ambient conditions at room temperature.

This procedure takes a relatively long time, but can be accelerated by controlled exposure to heat.

BRIEF DESCRIPTION OF THE DRAWINGS

The invention is further described below using the example shown diagrammatically in the figures.

DETAILED DESCRIPTION OF THE PREFERRED EMBODIMENTS

Figure 3:
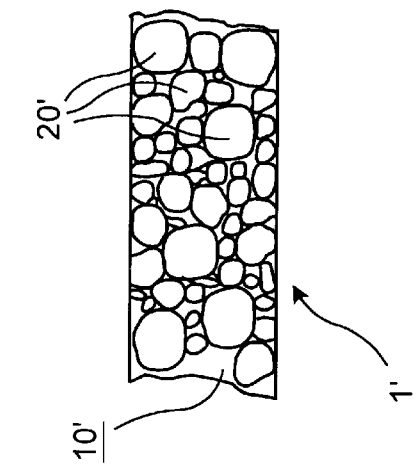
FIG. 3 shows a strand of the prior art by analogy with FIG. 1.

FIG. 3 shows a section of a strand 1', which is composed of an elastomer 10' and of an admixture of conducting particles 20'. The conductive particles 20' have been packed tightly within the elastomer 10' in order to ensure the required good electrical conductivity via a large number of contact points. The proportion of the particles 20' by volume, based on the total volume, is about 80%.

Figure 4:
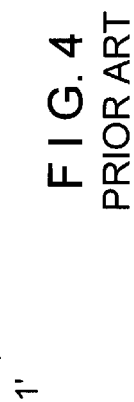
FIG. 4 shows a strand of the prior art by analogy with FIG. 2.

In FIG. 4 the strand 1' has been exposed to a force F, as arises in practice for example at a joint of a housing. The deformation shown diagrammatically is possible only if each of the particles 20' can be displaced to the side. Otherwise deformation is possible only to a very small extent, specifically until the particles 20' have their maximum close-packed density.

Figure 2:
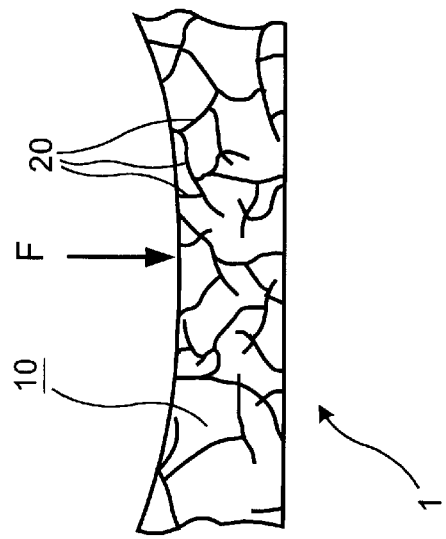
FIG. 2 shows a strand as in FIG. 1 after deformation.
Figure 1:
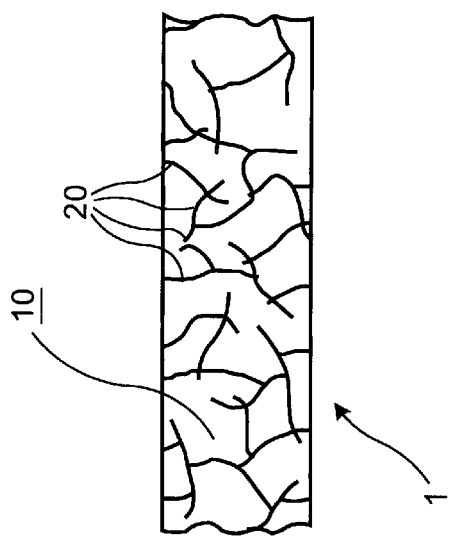
FIG. 1 shows a cross section of a strand of the paste.

FIGS. 1 and 2 show a strand 1 according to the invention. A large number of long, thin, flexible fibers 20 have been embedded in the elastomer material 10. They have random orientation, and the fibers 20 contact one another at a large number of contact points. Even without deformation, this ensures electrical conductivity, as indicated in FIG. 1.

It can be seen directly from FIG. 2 that problem-free deformation can occur on exposure to a force F. In this case the flexibility of the strand 1 is almost exclusively a function of the flexibility of the elastomer, since the proportion by volume of the fibers 20 is less than 10%. The fibers 20 provide only slight hindrance to the deformation of the strand 1.

There is substantial freedom in the choice of fibers 20. It is preferable to use extremely thin fibers which are relatively long and have a cross section of less than 0.1 mm. The length is at least twice the diameter, but the full effect of the advantage achievable is not seen until very much longer fibers are used. The diameter data above should not be understood as a restriction implying that the only fibers which can be used are those with approximately circular cross-section. Rather, the cross-sectional shapes which may be used include others, and may per se be as desired.

The fibers 20 may be composed of the materials commonly used for particles of this type, including, for example, naturally occurring materials. If the starting material for the fibers is nonconducting, the fibers are covered or coated with conductive material.

The strand 1 shown in FIGS. 1 and 2 has thus been permeated by a type of three-dimensional matrix of fibers 20, and the distribution of the fibers 20 and their contact points with one another, determined statistically over the cross section, is at least approximately constant.

It is apparent from the above that it is possible to form a conductive paste which has ideal mechanical and electrical properties and is also inexpensive. It is relatively easy here to achieve the desired processing properties, in particular via suitable choice of the elastomer, which may also be in the form of a two- or multicomponent material.

What is claimed is:

1. A conductive paste for the electrical industry comprising at least one elastomer and an admixture of a conductive component consisting of conducting particles in the form of fibers, wherein the fibers have been embedded in the elastomer in a random orientation to provide an irregular three-dimensional matrix of the fibers and contact points to provide a random distribution of conductivity.

2. A paste as claimed in claim 1, wherein the proportion of fibers, based on the total volume of the paste, is less than 50% by volume.

3. A paste as claimed in claim 2 wherein the proportion of fibers is less than 25% by volume.

4. A paste as claimed in claim 1, 2 or 3, wherein the fibers have a length/diameter ratio of more than 2.

5. A paste as claimed in claim 4, wherein the length/diameter ratio is more than 10.

6. A paste as claimed in claim 1, 2 or 3, wherein the fibers have a diameter less than 0.1 mm.

7. A paste as claimed in claim 1, 2 or 3, wherein the paste polymerizes at room temperature.

8. A paste as claimed in any of claims 1, 2 or 3, wherein the paste polymerizes on exposure to heat.

9. A paste as claimed in claim 1, 2 or 3, wherein the paste applied in the form of a strand directly in the region of a joint to form an electrically shielding gasket for a housing.

10. A paste as claimed in any of claims 1, 2 or 3, wherein the paste is moldable by injection molding or extrusion to provide a sealing element.

* * * * *